(12) United States Patent
Dimitrov et al.

(10) Patent No.: US 7,589,600 B2
(45) Date of Patent: Sep. 15, 2009

(54) SPIN OSCILLATOR DEVICE

(75) Inventors: Dimitar Velikov Dimitrov, Edina, MN (US); Xilin Peng, Bloomington, MN (US); Song S. Xue, Edina, MN (US); Dexin Wang, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 473 days.

(21) Appl. No.: 11/590,530

(22) Filed: Oct. 31, 2006

(65) Prior Publication Data

US 2008/0150640 A1 Jun. 26, 2008

(51) Int. Cl.
*H03B 28/00* (2006.01)
(52) U.S. Cl. .................................... 331/94.1
(58) Field of Classification Search ............ 331/3, 331/94.1
See application file for complete search history.

(56) References Cited

U.S. PATENT DOCUMENTS

| | | | |
|---|---|---|---|
| 5,695,864 A | 12/1997 | Slonczewski | |
| 6,130,814 A | 10/2000 | Sun | |
| 6,256,223 B1 | 7/2001 | Sun | |
| 6,744,086 B2 | 6/2004 | Daughton et al. | |
| 6,798,623 B2 | 9/2004 | Seigler et al. | |
| 6,835,926 B2 | 12/2004 | Weitekamp et al. | |
| 6,980,469 B2 | 12/2005 | Kent et al. | |
| 7,006,375 B2 | 2/2006 | Covington | |
| 2005/0219771 A1 | 10/2005 | Sato et al. | |
| 2006/0183002 A1* | 8/2006 | Yang et al. | 428/811 |

OTHER PUBLICATIONS

W.H. Rippard, M.R. Fpufall, S. Kaka, T.J. Silva, and S.E. Russek; Injection Locking and Phase Control of Spin Transfer Nano-oscillators; Aug. 5, 2005; pp. 067203-1-067203-4; Physical Review Letters The American Physical Society.
J. Z. Sun; Spin angular momentum transfer in current-perpendicular nanomagnetic junctions; Jan. 2006; pp. 81-100; IBM J. Res. & Dev. vol. 50 No. 1.
M. R. Pufall, W. H. Rippard, Shehzaad Kaka, S. E. Russek, and T. J. Silva; Large-angle, gigahertz-rate random telegraph switching induced by spin-momentum transfer; Jun. 8, 2004; pp. 214409-1-214409-5; Physical Review B 69, 214409 (2004).
F. B. Mancoff, N. D. Rizzo, B.N. Engel & S. Tehrani; Phase-locking in double-point-contact spin-transfer devices; Sep. 15, 2005; pp. 393-395; vol. 437; 2005; Nature.

(Continued)

*Primary Examiner*—David Mis
(74) *Attorney, Agent, or Firm*—Kinney & Lange, P.A.

(57) ABSTRACT

A spin oscillator device generates a microwave output in response to an applied DC current. The device includes a spin momentum transfer (SMT) stack including a top electrode, a free layer, a nonmagnetic layer, a pinned magnetic structure, and a bottom electrode. A local magnetic field source adjacent the SMT stack applies a local magnetic field to the free layer to cause the magnetization direction of the free layer to be oriented at a tilt angle with respect to plane of the free layer. The local magnetic field source can include coils or an electromagnet structure, or permanent magnets in close proximity to the SMT stack.

40 Claims, 8 Drawing Sheets

OTHER PUBLICATIONS

A. A. Wolf, A. Y. Chtchelkanova, D. M. Treger; Spintronics—A retrospective and perspective; Jan. 2006; pp. 101-110; IBM J. Res. & Dev. vol. 50 No. 1.

Shehzaad Kaka, Matthew R. Pufall, William H. Rippard, Thomas J. Silva, Stephen E. Russek & Jordan A. Katine; Mutual phase-locking of microwave spin torque nano-oscillators; 2005; Nature (Sep. 15, 2005); vol. 437, pp. 389-392.

Daniel C. Ralph and Robert A. Buhrman, "Coherence of Microwave Frequency Nanomagnetic Dynamic Driven by a DC Spin-Polarized Current" in: Cornell NanoScale Science and Technology Facility, the 2004-2005 CNF Research Accomplishments (New York, Cornell NanoScale Science and Technology Facility, 2005) pp. 260-261.

Robert A. Buhrman, "Spin Transport and Spin Momentum Transfer in Current Confined Nanopillar Spin Valves" in: Cornell NanoScale Science and Technology Facility, the 2004-2005 CNF Research Accomplishments (New York, Cornell NanoScale Science and Technology Facility, 2005) pp. 244-245.

"Spin-transfer torque in a single ferromagnet" (YI JI) Mar. 23, 2004 (abstract) Spin Momentum Transfer Physics: Recent Exper. Progress [online] Ridge, New York, USA: American Physical Society [Retrieved on Jun. 2, 2006] Retrieved from the Internet <URL: http://flux.aps.org/meetings/YR04/MAR04/baps/abs/S2810.html>.

Shehzaad Kaka; "Past, Present, and Future of MRAM"; The Premier Advanced Recording Technology Forum; National Institute of Standards and Technology; Jul. 22, 2003; pp. 1-20.

A. Rebei and M. Simionato; Fluctuations of the Magnetization in thin films due to Conduction electrons; Report arXiv: cond-mat/04125190v1 [online]; Dec. 10, 2004 [Retrieved on Jun. 2, 2006]. Retrieved from the Cornell University Library's arXiv service using Internet <Url: http://arxiv.org/abs/cond-mat/0412510v1>; pp. 1-49.

J.C. Slonczewski; Conductance and exchange coupling of two ferromagnets separated by a tunneling barrier; Apr. 1989; Physical Review B; vol. 39, No. 10; pp. 6995-7002.

Olga Kazakova, Carol Webster, Alexander Tzalenchuk; "Metrological Challenges of Nanomagnetism"; Oct. 2005; National Physics Laboratory Report; Report No. DEM-TQD-002; pp. 1-82.

'Spins in Solids Summer School About' (Stuart A. Wolf), 2005, [online], [Retrieved on Jun. 2, 2006], Retrieved from the University of Virginia, Charlottesville (VA), using Internet <URL: http://people.virginia.edu/~saw6b/summerschool/about.html>. pp. 1-2.

* cited by examiner

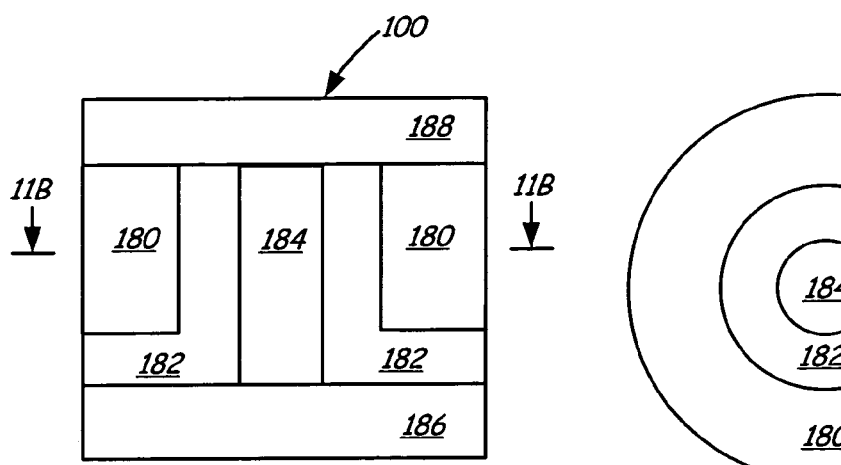
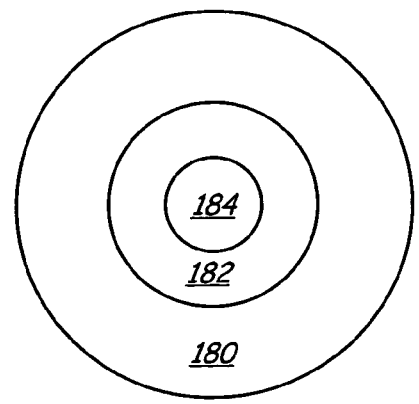
FIG. 11A  FIG. 11B
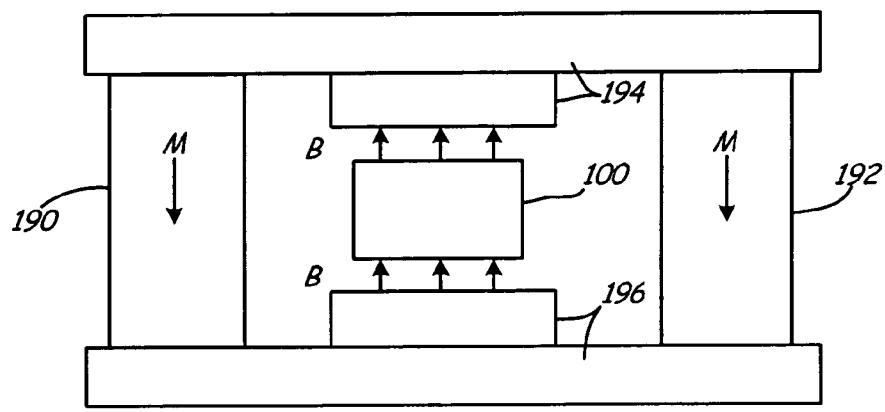
FIG. 12

SPIN OSCILLATOR DEVICE

BACKGROUND OF THE INVENTION

The present invention relates to microwave oscillators. In particular, the present invention is a nanoscale oscillator device which generates microwave output by applying a DC electric current through a layered magnetic structure with nanometer dimensions.

"Spin Momentum Transfer" (SMT) or "Spin Torque Transfer" was predicted to exist by Slonczewski in an article published in Phys. Rev. B, Volume 39(10), 6995, 1989. Since that time, Spin Momentum Transfer has been an area of interest primarily for use in MRAM devices. In 2005, two groups (one based at the National Institute of Standards and Technology (NIST) in Boulder, Colo., and the other at Free Scale Semiconductor Inc. in Chandler, Ariz.) reported experimental results of phase-locked microwave spin transfer or spin torque oscillators: Kaka et al., "Mutual Phase-locking of Microwave Spin Torque Nano-oscillators", Nature, Vol. 437 (15), 389-392 (September 2005). Mancoff et al., "Phase-locking in Double-Point-Contact Spin-Transfer Devices" Nature, Vol. 437 (15), 393-395 (September 2005).

In addition to these two articles, there have been other publications which have also discussed spin momentum transfer as a mechanism for an oscillator in the GHz spectrum. These include: Pufall, "Large-angle, Gigahertz-Rate Random Telegraph Switching Induced by Spin-Momentum Transfer", Phys. Rev. B, 69, 214409 (2004); Wolf et al., "Spintronics—A Retrospective and Perspective," IBM J. Res. & Dev. Vol. 50, No. 1, 101-109 (January 2006); Kazakova et al., "NPL Report" DEM-TQD-002 "Metrological Challenges of Nanomagnetism," section 4.2.2.3, pages 27-28 (October 2005); Ralph et al., "Coherence of Microwave-Frequency Nanomagnetic Dynamics Driven by a DC Spin-Polarized Current," Cornell NanoScale Facility Project #598-96, page 260; Rippard et al., "Injection Locking and Phase Control of Spin Transfer Nano-oscillators," Physical Review Letters, PRL 95, 067203 (2005); and Sun, "Spin Angular Momentum Transfer in Current-Perpendicular Nanomagnetic Junctions," IBM J. Res. & Dev., Vol. 50, No. 1 (2006).

BRIEF SUMMARY OF THE INVENTION

A device for producing electrical output in the GHz spectrum includes a spin momentum transfer (SMT) stack or nano-oscillator and a local magnetic field source adjacent the stack. The local magnetic field source applies a local magnetic field to a free layer of the spin momentum transfer stack to cause the magnetization direction of the free layer to be oriented at a tilt angle with respect to the plane of the free layer. An output in the GHz spectrum is produced by applying a DC electric current through the spin momentum transfer stack in a direction perpendicular to the plane of the free layer. The frequency of the output is a function of the strength of the local magnetic field at the SMT stack.

The local magnetic field source can take a number of different forms, and can be an active or a passive type of magnetic source. Examples of active sources include a horseshoe magnet with magnetic poles positioned above and below the SMT stack; a pair of pancake coils positioned above and below the stack; a helical coil that surrounds the stack; an electromagnet with a high moment pole positioned either below or above the stack; and a magnetic field generator including an annular pole and a coil that surround the stack. Examples of passive local magnetic field sources include a permanent magnet positioned above or below the stack; a pair of permanent magnets positioned above and below the stack so that the stack is sandwiched between the magnets; a toroidal permanent magnet coaxially aligned and surrounding the oscillator; and a pair of permanent magnets coupled to a top flux guide and a bottom flux guide, with the stack positioned between the top and bottom flux guides.

BRIEF DESCRIPTION OF THE DRAWINGS

FIGS. 11A and 11B are cross-sectional views showing a nano-oscillator positioned coaxially with a surrounding steroidal permanent magnet.

FIG. 12 shows a nano-oscillator positioned within a vertical field created by permanent magnets and flux guides.

DETAILED DESCRIPTION

Figure 1:
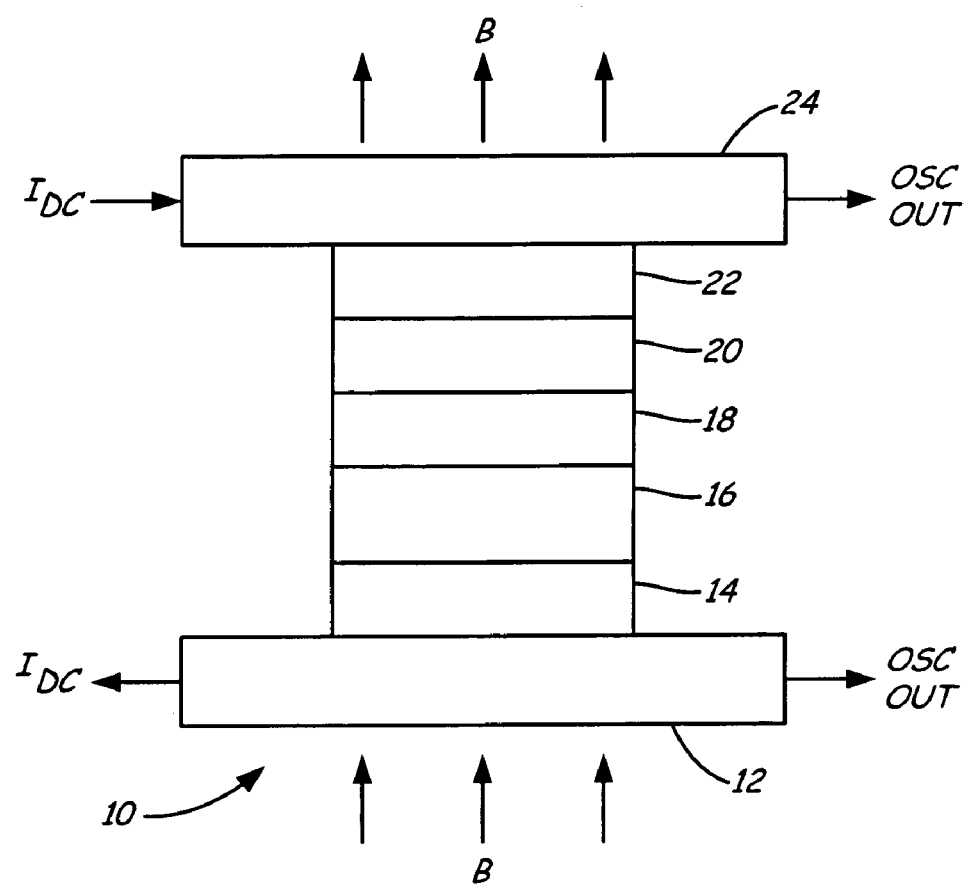
FIG. 1 shows a spin momentum transfer stack in the form of an individual nano-pillar.

FIG. 1 schematically shows nano-oscillator 10, which includes bottom electrode 12, seed layer 14, pinned magnetic structure 16, non-magnetic layer 18, free layer 20, cap layer 22, and top electrode 24. In this particular schematic diagram, nano-oscillator 10 is depicted as a single nano-pillar, although it can also be in the form of an array of nano-pillars positioned between bottom electrode 12 and top electrode 24.

Pinned magnetic structure 16 can comprise a single magnetic layer with large anisotropy that prevents magnetic rotation in an external magnetic field. Alternatively, pinned magnetic structure can comprise a synthetic antiferromagnetic (SAF) structure that is stabilized by an adjacent antiferromagnetic layer.

Free layer 20 may be a magnetically soft single layer or may be an SAF type structure. In either case, operation of nano-oscillator 10 requires that the magnetization direction of free layer 20 be tilted or canted with respect to the plane of free layer 20. In other words, there must be a component of the magnetization direction in free layer 20 that is in the direction perpendicular to the plane.

Non-magnetic layer 18 can be a tunnel barrier layer, a continuous metallic spacer layer, or a current constrained path (CCP) metallic layer. Magnetic material of pinned magnetic structure 16 and free layer 20 adjacent the interfaces with non-magnetic layer 18 can be a transition metal alloy, or a half metallic layer.

A tilting of the magnetization direction of free layer 20 is produced by a local magnetic field source that is positioned adjacent to nano-oscillator 10. The local magnetic field source applies a local magnetic field B in a direction perpendicular to the plane of free layer 20. The local magnetic field source can be an active device which relies on external electric current to generate the magnetic field, or can be a passive device, which relies upon permanent magnetism. Examples of active local magnetic sources are shown in the embodiments shown in FIGS. 4-8B. Examples of embodiments using a passive local magnetic field source are shown in FIGS. 9-12.

Electrodes 12 and 24 are used to direct a DC current $I_{DC}$ through nano-oscillator 10 in a direction perpendicular to the plane of free layer 20. Electrodes 12 and 24 can also be used to extract the oscillator output signal OSC OUT, which is typically in the GHz frequency range.

One limitation of nano-oscillators based on spin momentum transfer phenomena is relatively low power output of those devices. Recently, it has been shown that under appropriate conditions, closely spaced SMT devices can be locked together in frequency and phase. The coherent nature of the locked state enables the output power from N oscillators that are phase-locked to grow proportionately to $N^2$ rather than N, as would be the case for N oscillators that are not phase-locked. For self-locking to occur, the individual oscillators need to be spaced closer than about 150 nm. This can be achieved by fabricating a large number of closely spaced nano-pillars that are individually patterned.

Figure 2:
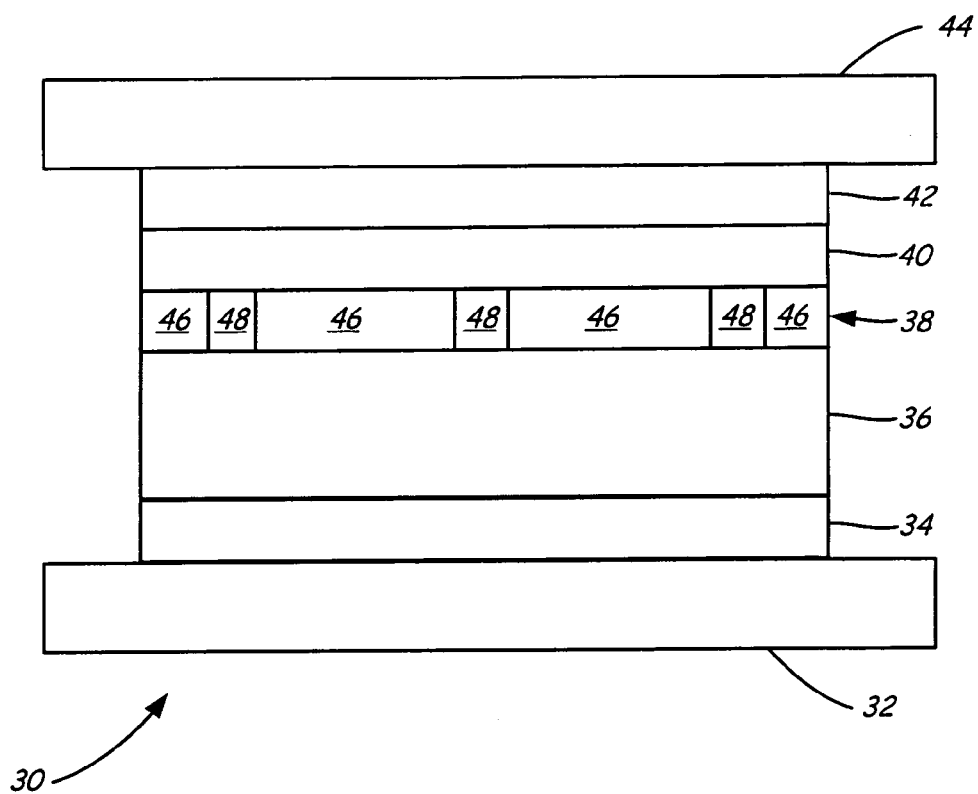
FIG. 2 shows a nano-oscillator having an array of self-locked oscillators defined by a current constrained path layer between a free layer and a pinned magnetic structure.
Figure 3:
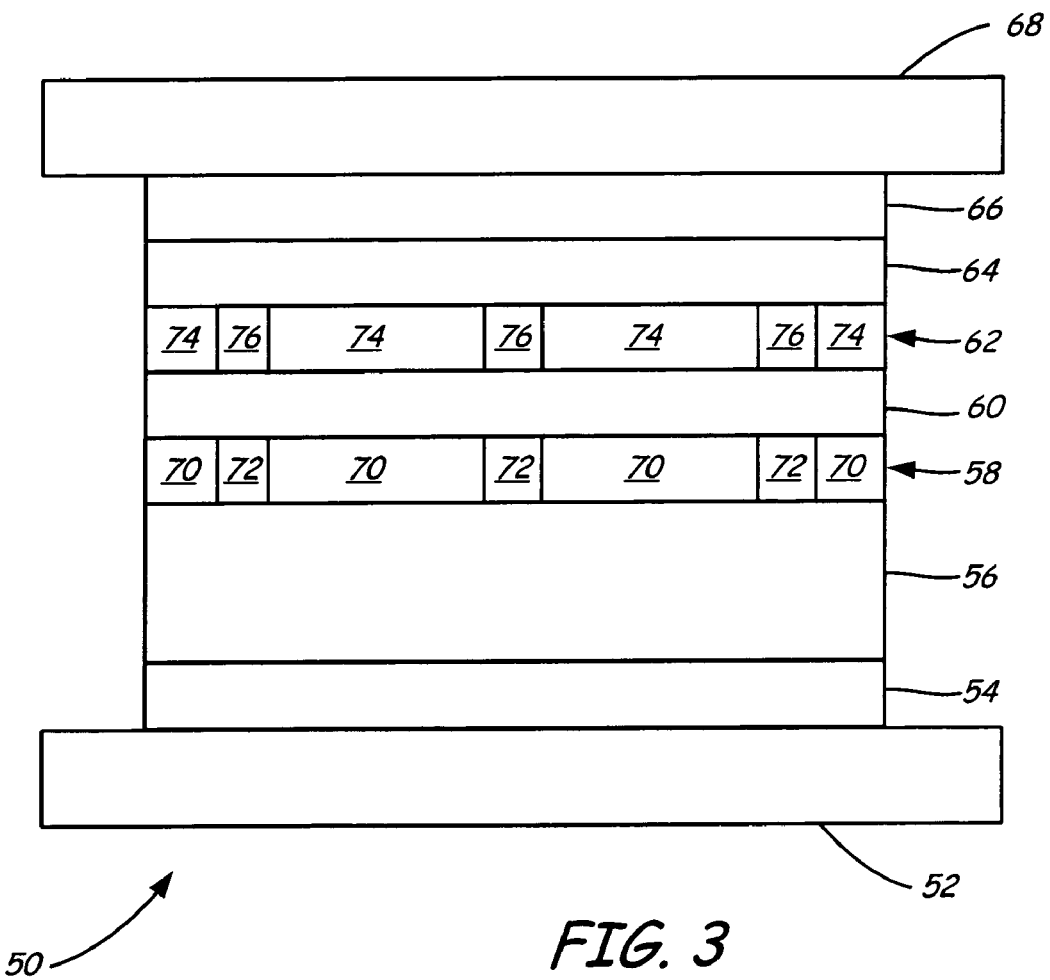
FIG. 3 shows a nano-oscillator having an array of self-locked oscillators including a pair of free layers and a pair of current constrained path layers.

FIGS. 2 and 3 illustrate an alternative to individually patterned pillars to create a phase-locked array of SMT devices. The oscillators shown in FIGS. 2 and 3 use a current confining path (CCP)-current perpendicular to plane (CPP) spin valve stack structure. Examples of the CCP-CPP spin valve stacks used to form an array of closely spaced oscillators are shown in FIGS. 2 and 3.

Oscillator 30 shown in FIG. 2 includes bottom electrode 32, seed layer 34, pinned magnetic structure 36, nonmagnetic CCP layer 38, free layer 40, cap layer 42, and top electrode 44. The structure of oscillator 30 is generally similar to the structure shown in FIG. 1 except for nonmagnetic CCP layer 38.

CCP layer 38 is formed primarily of oxide matrix 46 with conductive channels 48 extending through matrix 46 between pinned magnetic structure 36 and free layer 40. Current flowing in a direction perpendicular to the plane of the individual layers will be constrained to flow through conductive channels 48, thereby effectively creating an array of SMT pillars that are closely spaced to one another so that phase locking can occur.

CCP layer 38 can be formed in a number of different ways. In one approach, controlled etching of oxide layer 46 creates pin holes which can then be filled with conductive material to serve as conducting channels 48. In another approach, an amorphous layer is deposited, which is predominately oxide with a small percentage of metal suitable for a high giant magnetoresistive (GMR) effect. Examples of suitable metals include copper, gold, silver, and alloys of those metals. The oxide and metal are chosen such that they are immiscible, but due to the highly non-equilibrium nature of the sputtering process, they can be deposited as a uniform amorphous film. Subsequent annealing promotes segregation of the metal from the oxide to form the conducting channels between pinned magnetic structure 36 and free layer 40. The size and spacing between conducting channels 48 can be controlled by annealing conditions.

FIG. 3 shows oscillator 50, which makes use of multiple CCP layers to create an array of nano-pillars. In FIG. 3, oscillator 50 includes bottom electrode 52, seed layer 54, pinned magnetic structure 56, first CCP layer 58, first free layer 60, second CCP layer 62, second free layer 64, cap layer 66, and top electrode 68. CCP layer 58 includes oxide matrix 70 and conductive channel 72. Similarly, second CCP layer 62 includes oxide matrix 74 and conductive channel 76.

Oscillator 50 offers the potential of higher output power by the use of two free layers 60 and 64 and two CCP spacer layers 58 and 62. The formation of CCP layers 58 and 60 can be similar to the formation of CCP layer 38 of oscillator 30 (FIG. 2).

With each of the oscillators 10, 30, and 50 shown in FIGS. 1-3, oscillation in the GHz range through spin momentum transfer occurs by supplying a DC drive current perpendicular to the plane through a nano-oscillator. The spin momentum transfer phenomenon results from an exchange of angular momentum between spin polarized current and the magnetization within a thin magnetic layer. The present invention uses a local magnetic field source to tilt the magnetization direction of the free layer or free layers of a nano-oscillator. The strength of the local magnetic field at the free layer(s) determines oscillation frequency.

Nano-oscillators have potential application to integrated circuits, write assist for magnetic writers in disc drives, and other devices requiring extremely small sources of GHz range signals. The present invention makes use of a local magnetic field source that delivers a magnetic field that is maximized at the SMT nano-oscillator and decreases in field strength rapidly with distance from the nano-oscillator. The local magnetic field is effectively confined or localized, for example, to a sub-millimeter range from the nano-oscillator. A localized range of up to about 10 to 20 microns for the local magnetic field from the nano-oscillator allows the nano-oscillator to have practical application to devices requiring extremely small dimensions.

Embodiments showing different local magnetic field sources in combination with a nano-oscillator are illustrated in FIGS. 4-12. In each embodiment, nano-oscillator 100 is a spin momentum transfer nano-scale device that may be a single pillar or an array of nano-pillars. Nano-oscillator 100 can be a form shown in any one of FIGS. 1-3, but can also take other forms, such as those described in the articles referenced in the Background of the Invention. In each case, current flow through nano-oscillator 100 is in a direction perpendicular to the plane of the film layers, and nano-oscillator 100 is illustrated in FIGS. 4-12 with an orientation so that current perpendicular to the plane (CPP) will be flowing in the vertical direction. For simplicity in illustration, the electrical connections to nano-oscillator 100 for providing the DC drive current $I_{DC}$ and for extracting the oscillator output signal OSC OUT are not shown in FIGS. 4-12.

Figure 4:
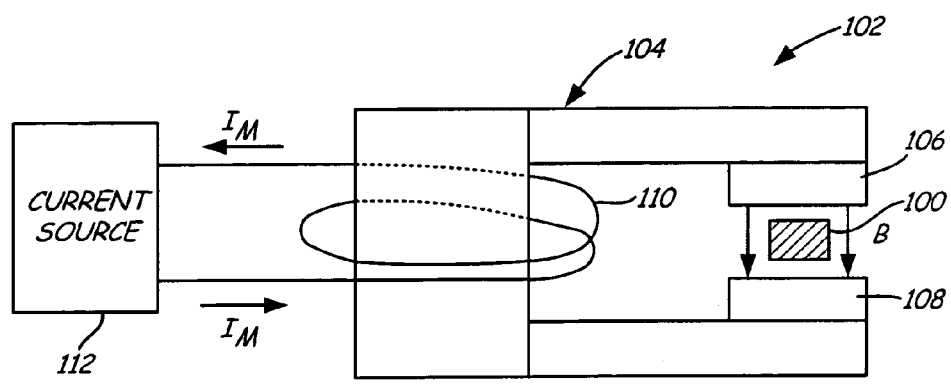
FIG. 4 shows a nano-oscillator sandwiched between poles of a horseshoe magnet.

FIG. 4 shows an example of an active approach to generating a local vertical magnetic field through nano-oscillator 100. Horseshoe magnet 102, which includes yoke 104, poles 106 and 108, and coil 110, is the local magnetic field source.

Nano-oscillator 100 is sandwiched between poles 106 and 108 of horseshoe magnet 102. The material in yoke 104 and poles 106 and 108 has a permeability that is small in the GHz range, since the oscillating magnetic fields within nano-oscillator 100 need to be transmitted with minimal loses.

Local magnetic field B applied to nano-oscillator 100 by horseshoe magnet 102 is produced by coil 110 in response to current $I_M$ from current source 112. Magnetic field B flows between poles 106 and 108 through nano-oscillator 100 in a vertical direction. This design is capable of providing very high magnetic fields low power and high localization.

Figure 5:
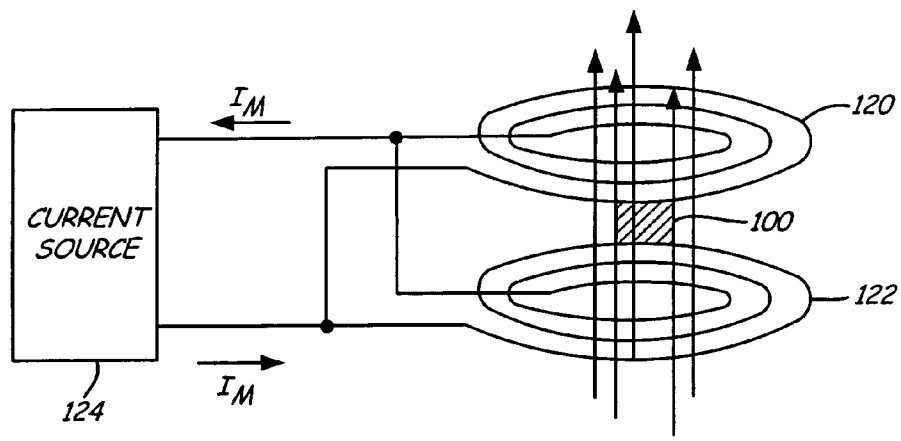
FIG. 5 shows a nano-oscillator sandwiched between two pancake coils.

FIG. 5 shows a second embodiment in which nano-oscillator 100 is sandwiched between helical pancake coils 120 and 122. Current source 124 provides current $I_M$ flowing through coils 120 and 122 to generate local magnetic field B in a vertical direction through nano-oscillator 100.

Figure 6:
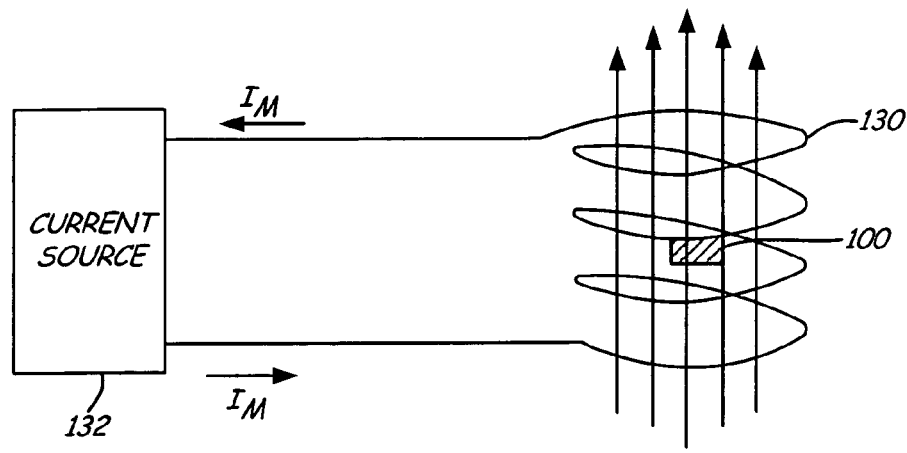
FIG. 6 shows a nano-oscillator positioned in the center of a helical coil solenoid.

FIG. 6 shows an embodiment in which nano-oscillator 100 is positioned in the center of helical coil solenoid 130. Current $I_M$ flows from current source 132 through the helical coils of solenoid 130 to produce local magnetic field B in a vertical direction as shown in FIG. 6.

Figure 7:
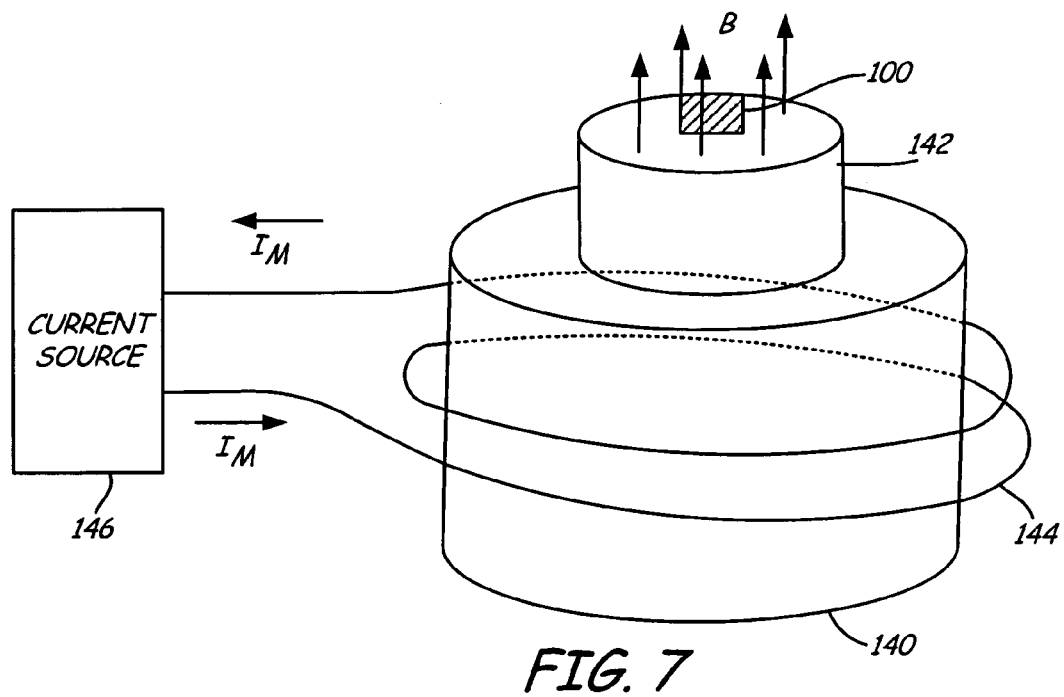
FIG. 7 shows a nano-oscillator positioned on top a straight electromagnet that includes a yoke, a pole, and helical coils.

FIG. 7 shows an embodiment in which a local magnetic field is produced by a straight electromagnet comprised of yoke 140, high moment pole 142, and helical coil 144. Current source 146 provides current $I_M$ to helical coil 144 to nano-oscillator 100 is positioned above high moment pole 142 in vertically-oriented local magnetic field B. The design shown in FIG. 7 differs from the horseshoe magnet design shown in FIG. 4 in that it does not require small high frequency permeability for yoke 140 and pole 142.

Figure 8A:
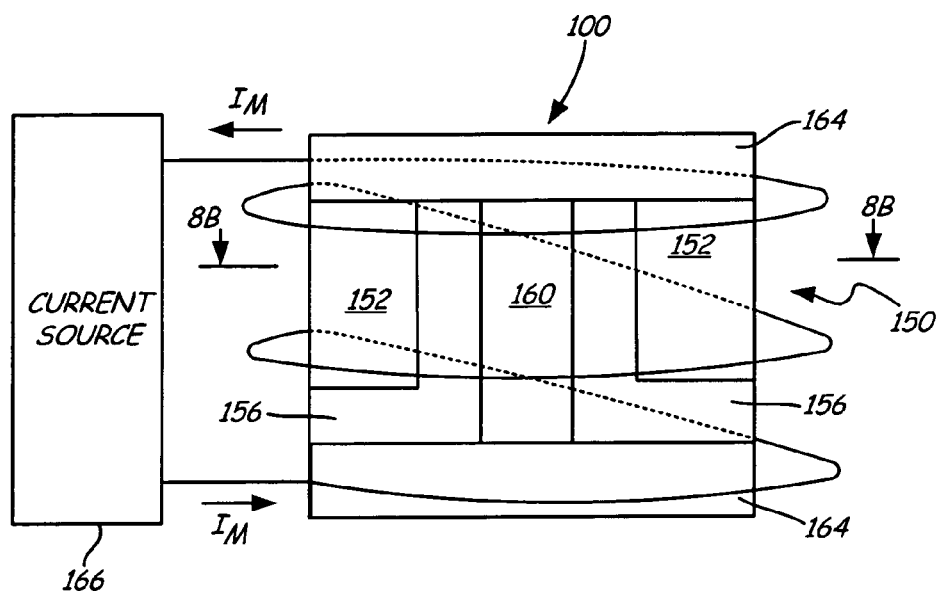
FIGS. 8A and 8B are cross-sectional views showing a nano-oscillator positioned coaxially within a cylindrically shaped magnetic field generator.
Figure 8B:
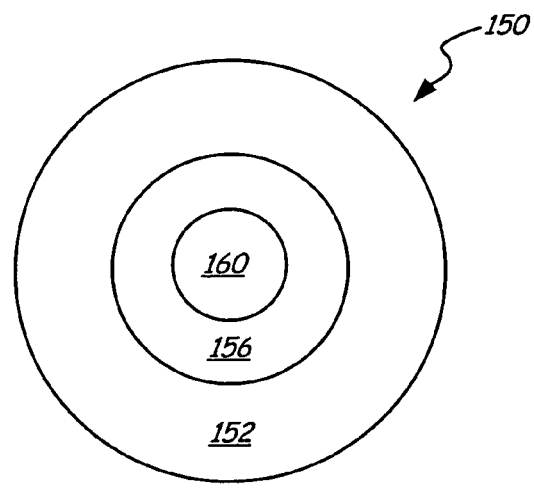

FIGS. 8A and 8B show an embodiment in which nano-oscillator 100 is incorporated in the middle of a circularly shaped magnetic field generator 150, which includes toroidol or annular magnetic pole 152, coil 154, and insulator 156. As shown in FIGS. 8A and 8B, nano-oscillator 100 (which includes SMT stack or pillar(s) 160, bottom electrode 162 and top electrode 164) is electrically isolated from pole 152 by insulator 156. As shown, insulator 156 separates pole 152 from bottom electrode 162 so that vertical dc drive current between top electrode 164 and bottom electrode 162 is constrained to flow through SMT stack 160. Coil 154 is used to energize pole 152, which in turn creates a vertical magnetic field through the central axial opening of pole 152, where nano-oscillator 100 is located. Current $I_M$ to coil 154 is supplied by write current source 166. As shown in FIG. 8A, current $I_M$ through coil 154 creates a magnetic field that magnetizes pole 152 so that the local magnetic filed B from pole 152 travels from the top end of pole 152, downward through the open center of pole 152 (where SMT stack 160 is located) and back to the bottom end of pole 152. Therefore, local magnetic field B produced by coil 154 and pole 152 is oriented downward through SMT stack in FIG. 8A.

Figure 9:
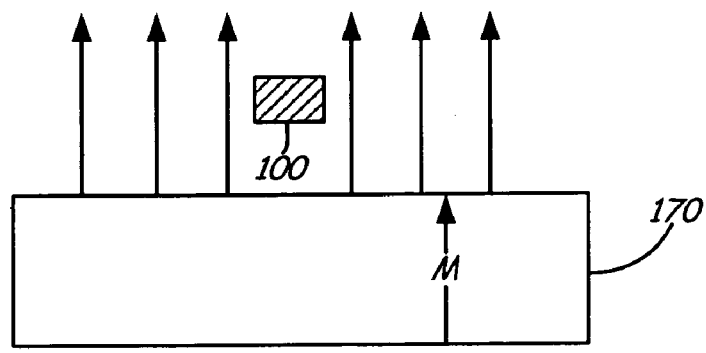
FIG. 9 shows a nano-oscillator positioned above a permanent magnet.

FIG. 9 shows an embodiment using a passive approach to create a vertical magnetic field. In this embodiment, nano-oscillator 100 is placed over permanent magnet 170. The coercivity of permanent magnet 160 is larger than the self-demagnetizing field. Local vertical magnet field B is provided to nano-oscillator 100 to provide the tilt to the magnetization direction of the free layer or layers.

Figure 10:
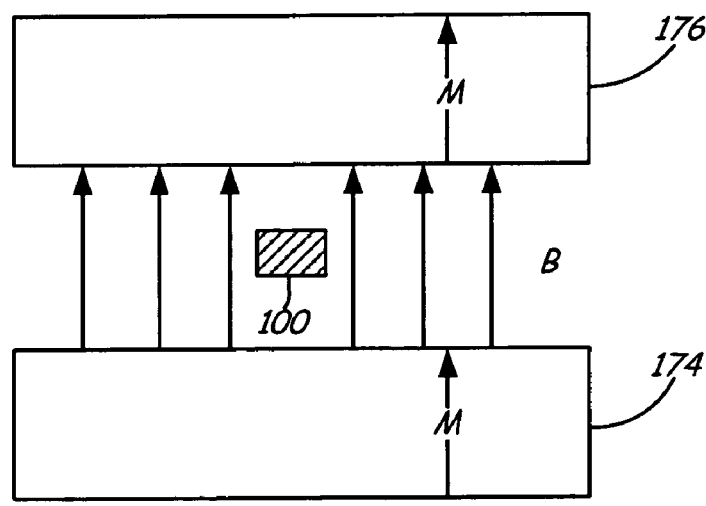
FIG. 10 shows a nano-oscillator sandwiched between two flat permanent magnets whose magnetization is perpendicular to their surface.

FIG. 10 shows another embodiment using a passive approach to generate a magnetic field. In this embodiment, nano-oscillator is sandwiched between permanent magnets 174 and 176. Permanent magnets 174 and 176 are flat permanent magnets whose magnetization is perpendicular to their surfaces. The coercivity of permanent magnets 174 and 176 is larger than the self-demagnetizing field.

FIGS. 11A and 11B show a passive approach that is generally similar to the active approach shown in FIGS. 8A and 8B. In this passive approach, nano-oscillator 100 is placed in the middle of an annular shaped permanent magnet 180. Nano-oscillator 100 is electrically isolated from permanent magnet 180 by insulator 182. In FIG. 11A, SMT stack 184, bottom electrode 186 and top electrode 188 of nano-oscillator 100 are shown.

FIG. 12 shows an embodiment in which a vertical magnetic field is applied to nano-oscillator 100 by a local magnetic field source that includes permanent magnets 190 and 192, top flux guide 194, and bottom flux guide 196. Flux guides 194 and 196 are made of soft magnetic material.

Although the present invention has been described with reference to preferred embodiments, workers skilled in the art will recognize that changes may be made in form and detail without departing from the spirit and scope of the invention.

The invention claimed is:

1. A device comprising:
   a spin momentum transfer (SMT) stack including a top electrode, a free layer, a non-magnetic layer, a pinned magnetic structure, and a bottom electrode; and
   a local magnetic field source adjacent the SMT stack for applying a local magnetic field to the free layer to cause a magnetization direction of the free layer to be oriented at a tilt angle with respect to a plane of the free layer.

2. The device of claim 1, wherein the local magnetic field source comprises at least one current carrying coil for producing the local magnetic field as a function of current flowing through the coil.

3. The device of claim 2, wherein the local magnetic field source comprises a yoke, a pair of magnetic poles connected to the yoke, and a current carrying coil for inducing the local magnetic field within the yoke and the magnetic poles, and wherein the SMT stack is positioned between the pair of magnetic poles.

4. The device of claim 2, wherein the local magnetic field source comprises a first coil and a second coil; and wherein the SMT stack is positioned between the first coil and the second coil.

5. The device of claim 2, wherein the local magnetic field source comprises a helical coil; and wherein the SMT stack is positioned within the helical coil.

6. The device of claim 2, wherein the local magnetic field source comprises a yoke, a high moment pole, and a coil positioned around the yoke; and wherein the SMT stack is positioned adjacent the high moment pole.

7. The device of claim 2, wherein the local magnetic field source comprises a magnetic field generator including an annular pole and a coil surrounding the pole for energizing the pole to apply the local magnetic field to the SMT stack; wherein the SMT stack is positioned concentrically within and is electrically isolated from the pole.

8. The device of claim 1, wherein the local magnetic field source comprises at least one permanent magnet.

9. The device of claim 8, wherein the SMT stack is positioned on top of the permanent magnet.

10. The device of claim 8, wherein the SMT stack is positioned between a first permanent magnet and a second permanent magnet.

11. The device of claim 8, wherein the permanent magnet is toroidal, and the SMT stack is concentrically positioned within and electrically isolated from the permanent magnet.

12. The device of claim 8, wherein the local magnetic field source comprises a first permanent magnet, a second permanent magnet, a first flux guide coupled to the first and second permanent magnets, and a second flux guide coupled to the first and second permanent magnets and spaced from the first flux guide; and wherein the SMT stack is positioned between the first and second flux guides.

13. The device of claim 1, wherein the local magnetic field is oriented in a direction generally perpendicular to the plane of the free layer.

14. The device of claim 1, wherein the local magnetic field is localized to an area within less than about one millimeter of the SMT stack.

15. The device of claim 14, wherein the local magnetic field is localized within about 20 microns of the SMT stack.

16. The device of claim 1, wherein the SMT stack comprises at least one SMT pillar.

17. The device of claim 16, wherein the SMT stack comprises an array of phase-locked SMT pillars.

18. The device of claim 1, wherein the non-magnetic layer comprises a current constrained path layer.

19. The device of claim 18, wherein the current constrained path layer comprises a plurality of metal current constrained paths in a matrix of insulating material.

20. The device of claim 18, wherein the SMT stack further comprises a second free layer and a second current constrained path layer.

21. A device comprising:
a spin momentum transfer nano-oscillator; and
a local magnetic field source for applying a local magnetic field to the nano-oscillator that is localized to within less than about one millimeter of the nano-oscillator.

22. The device of claim 21, wherein the local magnetic field source comprises at least one current carrying coil for producing the local magnetic field as a function of current flowing through the coil.

23. The device of claim 22, wherein the local magnetic field source comprises a yoke, a pair of magnetic poles connected to the yoke, and a current carrying coil for inducing the local magnetic field within the yoke and the magnetic poles, and wherein the nano-oscillator is positioned between the pair of magnetic poles.

24. The device of claim 22, wherein the local magnetic field source comprises a first coil and a second coil; and wherein the nano-oscillator is positioned between the first coil and the second coil.

25. The device of claim 22, wherein the local magnetic field source comprises a helical coil; and wherein the nano-oscillator is positioned within the helical coil.

26. The device of claim 22, wherein the local magnetic field source comprises a yoke, a high moment pole, and a coil positioned around the yoke; and wherein the nano-oscillator is positioned adjacent the high moment pole.

27. The device of claim 22, wherein the local magnetic field source comprises a magnetic field generator including an annular pole and a coil surrounding the pole for energizing the pole to apply the local magnetic field to the nano-oscillator; wherein the nano-oscillator is positioned concentrically within and is electrically isolated from the pole.

28. The device of claim 21, wherein the local magnetic field source comprises at least one permanent magnet.

29. The device of claim 28, wherein the nano-oscillator is positioned on top of the permanent magnet.

30. The device of claim 28, wherein the nano-oscillator is positioned between a first permanent magnet and a second permanent magnet.

31. The device of claim 28, wherein the permanent magnet is toroidal, and the nano-oscillator is concentrically positioned within and electrically isolated from the permanent magnet.

32. The device of claim 28, wherein the local magnetic field source comprises a first permanent magnet, a second permanent magnet, a first flux guide coupled to the first and second permanent magnets, and a second flux guide coupled to the first and second permanent magnets and spaced from the first flux guide; and wherein the nano-oscillator is positioned between the first and second flux guides.

33. The device of claim 21, wherein the nano-oscillator comprises:
a pinned magnetic structure;
a first non-magnetic layer adjacent the pinned magnetic structure;
a first layer adjacent the non-magnetic layer; and
top and bottom electrodes for supplying a d.c. current through the free layer, the non-magnetic layer and the pinned magnetic structure in a direction perpendicular to a plane of the free layer to generate a microwave output.

34. The device of claim 33, wherein the first non-magnetic layer comprises a current constrained path layer.

35. The device of claim 34, wherein the current constrained path layer comprises a plurality of metal current constrained paths in a matrix of insulating material.

36. The device of claim 34, wherein the nano-oscillator further comprises a second free layer and a second current constrained path layer.

37. The device of claim 33, wherein the local magnetic field is oriented in a direction generally perpendicular to the plane of the free layer.

38. The device of claim 21, wherein the nano-oscillator comprises at least one spin momentum transfer pillar.

39. The device of claim 38, wherein the nano-oscillator comprises an array of phase-locked spin momentum transfer pillars.

40. The device of claim 21, wherein the local magnetic field is localized within about 20 microns of the nano-oscillator.

* * * * *